United States Patent [19]
Strosser

[11] Patent Number: 5,627,475
[45] Date of Patent: May 6, 1997

[54] METAL DETECTOR COIL RESISTANCE TESTING

[75] Inventor: Richard P. Strosser, Akron, Pa.

[73] Assignee: New Holland North America, Inc., New Holland, Pa.

[21] Appl. No.: 414,788

[22] Filed: Mar. 31, 1995

[51] Int. Cl.$^6$ .................................................. G01R 31/06
[52] U.S. Cl. ........................................... 324/546; 324/549
[58] Field of Search ................................. 324/546, 547, 324/502, 549, 555

[56] References Cited

U.S. PATENT DOCUMENTS

| | | | |
|---|---|---|---|
| 4,746,869 | 5/1988 | Schrag et al. | 324/546 |
| 4,829,234 | 5/1989 | Gretsch | 324/546 |
| 5,111,149 | 5/1992 | Lebesch | 324/546 |

*Primary Examiner*—Louis M. Arana
*Attorney, Agent, or Firm*—Griffin, Butler Whisenhunt & Kurtossy

[57] ABSTRACT

A metal detector comprises a detection coil disposed in a magnetic field, the ends of the coil being connected through a balanced resistor network to the inputs of a differential amplifier. A test signal is injected into the metal detector at a point such that the coil is effectively in series with one branch of the balanced resistor network. The injected signal produces a potential difference at the inputs of the differential amplifier, the magnitude of the potential difference being dependent on the resistance of the detection coil. The test signal is generated by a circuit including a microcomputer which successively feeds digital values corresponding to the sine function to a digital-to-analog converter, so that the converter generates the test signal in the form of a sine wave. The output signal from the differential amplifier is applied to an analog-to-digital converter. The microcomputer controls the analog-to-digital converter to repetitively sample the output signal from the amplifier and convert each sample to a digital value. The digital values are compared with two threshold values corresponding to the maximum and minimum values the amplifier output signal may have when the coil resistance is within an acceptable range and when the amplifier output signal exceeds the maximum or is less than the minimum value an error indication is produced.

11 Claims, 2 Drawing Sheets

Fig. 1A

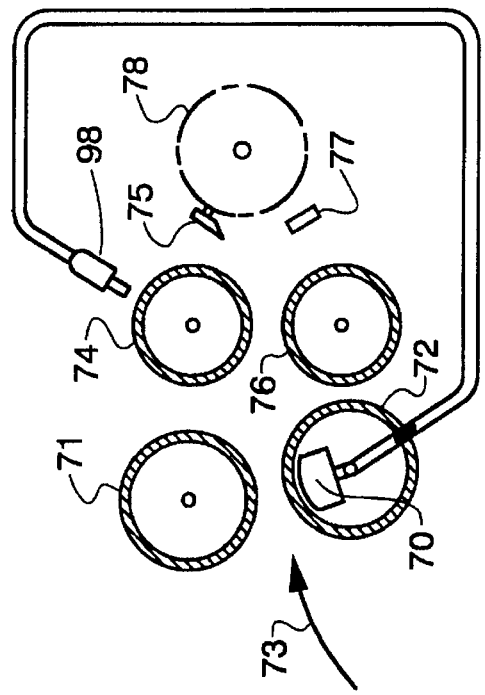
Fig. 2
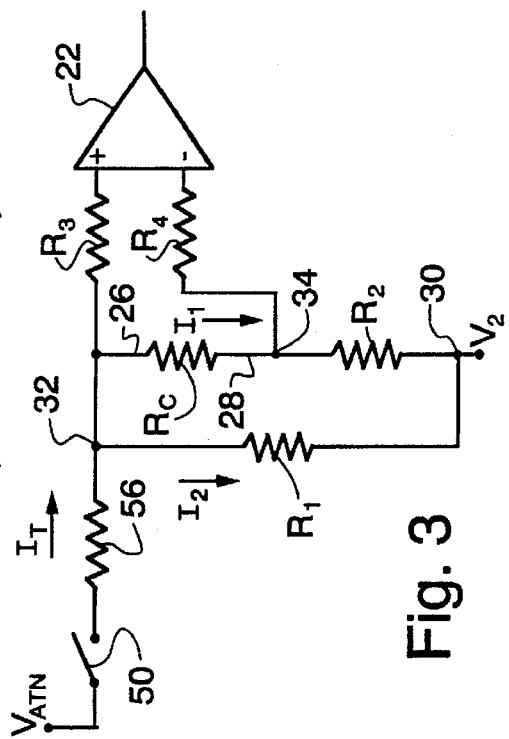
Fig. 3
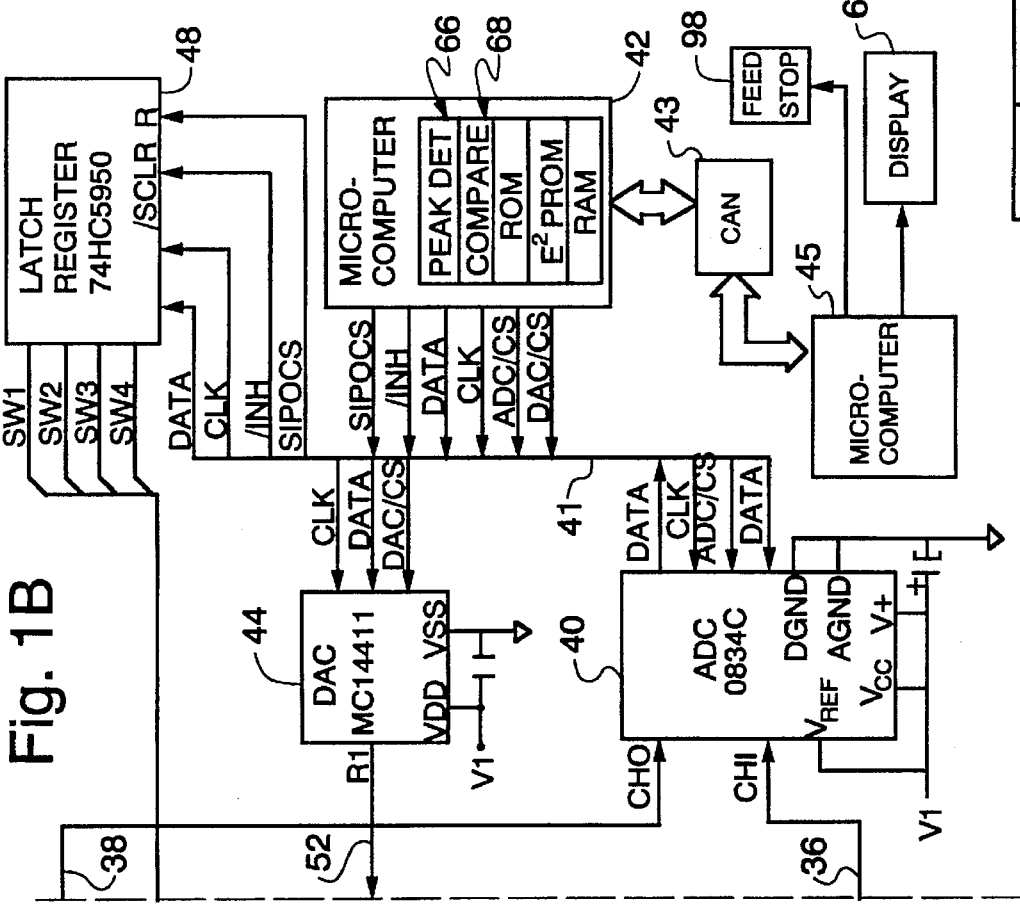
Fig. 1B
Fig. 1C
| 1A | 1B |

METAL DETECTOR COIL RESISTANCE TESTING

RELATED APPLICATIONS

This application discloses and claims subject matter disclosed in the concurrently filed application of Strosser et al., Ser. No. 08/414,330 entitled Metal Detector Coil Inductance Testing.

FIELD OF THE INVENTION

The present invention relates to a method and apparatus for testing the resistance of a coil in a metal detector by injecting a test signal into the coil and determining the magnitude of the output signal produced by the metal detector detection circuit connected to the coil.

BACKGROUND OF THE INVENTION

Agricultural machines such as forage harvesters are generally provided with metal detectors for detecting the presence of metal objects in crop material picked up from a field. Upon detection of a metal object the metal detector produces an output signal to stop the crop feed mechanism before the metal object can reach the cutter knives and cause damage. As shown in FIG. 2, the metal detector is frequently located within a housing 70 that is in turn located within a rotatable lower front feed roll 72. Crop material 73 is picked up from a field by a pick-up mechanism (not shown) and fed between lower and upper front feed rolls 72, 71 and lower and upper rear feed rolls 76, 74 to a cutter mechanism comprising a rotating reel 78 having peripheral cutter knives 75 cooperating with a stationary cutter bar 77 to cut the crop material. Obviously, metal objects fed between knives 75 and cutter bar 76 can severely damage the cutter mechanism. The metal detector prevents such damage by sensing metal objects and, upon sensing such an object, producing an output signal which is applied to a stop mechanism 98 to stop the feed rolls.

Because the metal detector coils are located within housing 70 and also within the feed roll 72, they are difficult to access. Furthermore, the coils are usually encased in a potting material and the electronic detection circuits to which the outputs of the coils are connected are also enclosed within housing 70 as described in U.S. Pat. No. 4,433,528, thereby making access to coil test points even more difficult. On the other hand, the resistance of the coils should be checked because changes in the resistance of a coil affects the output signal from the coil and thus the sensitivity of the metal detector to metal objects passing in proximity to the coil.

SUMMARY OF THE INVENTION

An object of the present invention is to provide a method and apparatus for testing an electrical characteristic of a metal detector coil by injecting a signal into the coil and sensing the magnitude of the output signal produced by a detection circuit connected to the coil.

Another object of the invention is to provide a method for testing the resistance of a metal detector coil connected to a detection circuit for amplifying an output signal produced across the coil when it detects a metal object, the method comprising injecting a signal into the coil and determining the magnitude of the resulting output signal from the detection circuit.

A further object of the invention is to provide an apparatus for testing the resistance of a detection coil in a magnetic metal detector wherein the detection coil has first and second ends coupled to first and second inputs of a detection circuit which produces an output signal having a magnitude dependent on the difference in potential at its inputs, the apparatus comprising: means for injecting a test signal into the detection coil to produce across the coil and the inputs of the detection circuit a potential difference that is dependent on the resistance of the coil; means, operative while the test signal is being injected, for comparing the magnitude of the output signal produced by the detection circuit with a first and a second reference signal value representing a maximum and a minimum magnitude, respectively, that the output signal may have when the resistance of the detection coil is within a normal range; and means for producing an indication that the resistance of the detection coil is outside the normal range of resistance when the magnitude of the output signal is greater than the first reference signal value or less than the second reference signal value.

Yet another object of the invention is to provide an apparatus as described above wherein the means for injecting the test signal includes a microcomputer for supplying digital values to a digital to analog converter to generate the test signal and means connecting the digital to analog converter to the detection coil. Preferably, the test signal is a sine wave.

Other objects and advantages of the invention and the manner of making and using it will become obvious upon consideration of the following description and the accompanying drawings.

BRIEF DESCRIPTION OF DRAWINGS

FIGS. 1A and 1B, when arranged as shown in FIG. 1C, comprise a wiring diagram of a metal detector having connected thereto a test apparatus according to the present invention;

FIG. 2 schematically illustrates the crop feed and cutter portions of a prior art forage harvester having a metal detector located in a feed roll; and, FIG. 3 is an equivalent circuit diagram used in explaining the operation of the metal detector in response to an injected test signal.

DETAILED DESCRIPTION OF PREFERRED EMBODIMENT

Figure 1A:
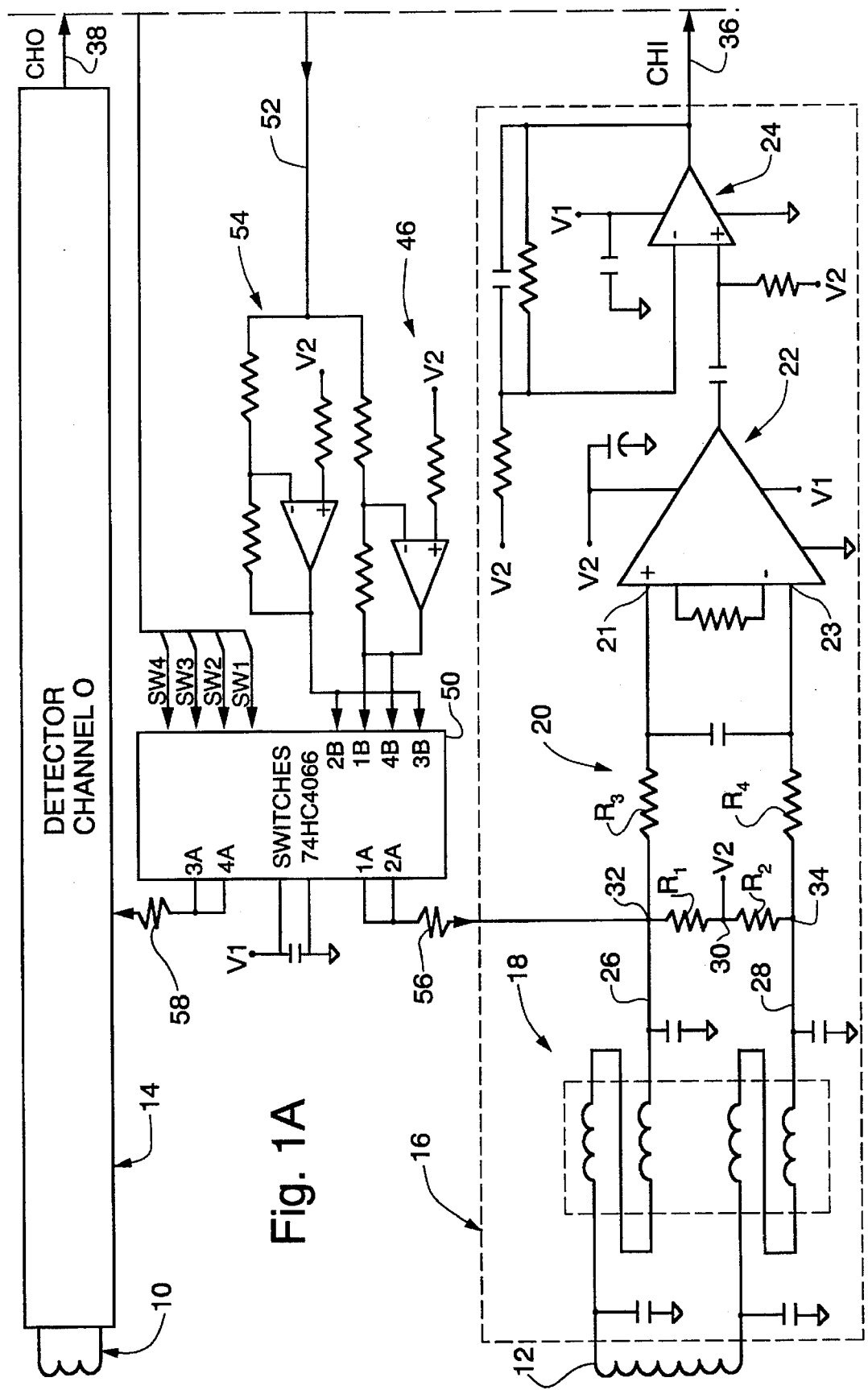

As shown in FIG. 1A, a typical metal detector of the prior art comprises first and second detector coils 10, 12 connected respectively to first and second channels or detection circuits 14, 16. It will be understood that coils 10, 12 are disposed in magnetic detection fields generated by suitable means (not shown) so that metal objects passing through the magnetic detection fields perturb the flux of the fields thereby inducing an emf in the coils. The arrangement of coils 10, 12 and the means for generating the magnetic fields may, for example, be as shown in U.S. Pat. No. 4,433,528.

The detection circuits 14, 16 are identical hence only the details of the detection circuit 16 are shown in FIG. 1A. Each detection circuit includes an RFI filter section 18, a balanced resistor network 20 feeding first and second inputs 21, 23 of a differential amplifier 22, and a low pass audio filter 24.

The ends of coil 12 are connected to inputs of the RFI filter section 18 which serves to filter out any radio frequency interference picked up by coil 12. The output leads 26, 28 of filter section 18 are connected to the balanced resistor network 20 which comprises four resistors $R_1$, $R_2$, $R_3$ and $R_4$. Resistors $R_1$ and $R_2$ have equal resistances (about 1K). A bias voltage V2 (+2.5 V) is connected to a junction 30 between first ends of $R_1$ and $R_2$. The second ends of $R_1$ and $R_2$ are connected to leads 26, 28 at junctions 32 and 34, respectively. Resistors $R_3$ and $R_4$ have equal resistances (about 250K). One end of resistor $R_3$ is connected to the first input 21 of differential amplifier 22 and the other end is connected to junction 32. One end of resistor $R_4$ is connected to the second input 23 of differential amplifier 22 and the other end is connected to junction 34.

Preferably, the detection coil 12 is located in a static magnetic detection field so that in the absence of movement of a metal object through the detection field there is no potential difference between the ends of coil 12 and V2 determines the voltages at the inputs of differential amplifier 22 and thus the steady state output of the amplifier. Moving parts of the agricultural machine distort the detection field and the field is further distorted each time a tramp metal object passes through the field. As the detection field is distorted, an emf is induced in coil 12. Since the ends of the coil are coupled to second ends of resistors $R_1$, $R_2$ the induced emf first adds to V2 at one of junctions 32, 34 and opposes V2 at the other junction as a metal object enters the detection field and then reverses polarity as the metal object leaves the detection field. This results in unequal voltages being applied to the inputs of the differential amplifier and it produces a bipolar output signal that varies about the steady state reference according to the difference in potential at inputs 21, 23.

The output signal from differential amplifier 22 is applied to the filter 24. Filter 24 filters out the high frequency "noise" caused by cyclic movement of parts of the agricultural machine in the detection field. The filtered bipolar signal CH1 at the output of filter 24 is applied via a lead 36 to one input of a multi-channel analog to digital converter (ADC) 40 (FIG. 1B).

The purpose of ADC 40 is to convert the magnitudes of the analog signals CH0 and CH1 to digital values representing the magnitudes of the signals. The ADC is controlled by a conventional microcomputer 42 having a CPU and RAM, ROM and $E^2$PROM memories. A serial link 41 interconnects the microcomputer and ADC. The microcomputer executes a program during which it sends signals to the ADC to enable the ADC, select one of the input channels, and transfer to the microcomputer a digital signal representing the magnitude of the output signal of the selected channel at the time the ADC is enabled. The ADC is controlled to sample and digitize each of the signals CH0 and CH1 every 2.5 ms. The ADC has a resolution of 256 steps (0–255) and is biased at 128. That is, when a detector channel output signal CH0 or CH1 is sampled by the ADC and has a value of zero, the ADC produces the digital value 128.

A positive and a negative threshold or reference value is stored in the $E^2$PROM memory of the microcomputer 42 for each of the metal detector channels. During normal operation of the metal detector, that is, during the time the metal detector is being operated to sense tramp metal objects, the microcomputer compares each digital value transferred from the ADC with the positive and negative threshold values for that channel. The threshold values define the upper and lower limits within which the magnitude of the output signal from a respective channel will fall as long as the coil connected to the channel does not detect the passage of a tramp metal object. If a comparison shows that a value produced by ADC 40 is greater than the positive threshold value or less than (i.e. more negative than) the negative threshold value with which it is compared, thereby indicating the detection of tramp metal, the microcomputer produces an output signal that is applied via serial data link 43, which may be a Controller Area Network (CAN), and a further microcomputer 45 to the stop mechanism 98 to stop the crop feed rolls.

According to the present invention, apparatus for testing the resistance of detector coils 10, 12 comprises a digital to analog converter (DAC) 44, an attenuator 46, a latch register 48 and FET switches 50 in addition to the ADC 40 and microcomputer 42.

DAC 44 is connected to microcomputer 42 via the serial data link 41. During a test of detection coil resistance, the microcomputer enables DAC 44 every 2.5 ms and transfers a digital value to a holding register in the DAC. The DAC converts the digital value to an equivalent analog voltage which is applied over a lead 52 to attenuator 46 and a buffer 54. The buffer 54 is used for inductance testing of coils 10 and 12 as described in the aforementioned copending application of Strosser et al. Inductance testing requires a larger test signal than resistance testing and since DAC 44 is used to generate the test signal for both tests, attenuator 46 serves to reduce the magnitude of the test signal during resistance testing.

The output of attenuator 46 is connected to inputs 1B and 4B of two FET switches 50 and the output of buffer 54 is connected to inputs 2B and 3B of two further FET switches 50. Only one of the switches is turned on at a time, the active switch being determined by which of the addressing or selection signals SW1–SW4 is active.

When signal SW1 is active, the output of attenuator 46 is passed through a first switch to output 1A and when SW2 is active the output of buffer 54 is connected through a second switch to output 2A. The outputs 1A and 2A are tied together and connected through a resistor 56 to the junction 32.

The signals SW3 and SW4 enable third and fourth switches, respectively so that the output of buffer 54 is passed through the third switch to output 3A or the output of attenuator 46 is passed through the fourth switch to the output 4A. Outputs 3A and 4A are connected together and are further connected through a resistor 58 to a point in detector channel 0 corresponding to the junction 32 in channel 1.

The selection signals are applied to switches 50 from the register 48. Register 48 is an 8-bit serial input, parallel output register with latches. The register receives data from microcomputer 42 via the serial data link 41.

When the resistance or inductance of a detection coil 10, 12 is to be tested, microprocessor 42 sends a code word to latch register 48 to select which detection coil 10, 12 is to receive the test signal and which test is to be performed. The test performed and the coil to which the test signal is applied are determined by a 1-bit in one of four bit positions of the code word as indicated in the following table:

TABLE I

| Code Word | Register Output | Test Performed |
| --- | --- | --- |
| 1000 0000 | SW1 | Resistance of coil 12 |
| 0100 0000 | SW2 | Inductance, signal applied to coil 12 |
| 0010 0000 | SW3 | Inductance, signal applied to coil 10 |
| 0001 0000 | SW4 | Resistance of coil 10 |

Assume that the resistance of coil 12 is to be tested. Register 48 is loaded with the code word 1000 0000 so that the register produces the signal SW1. The signal SW1 enables one of switches 50 to connect switch input 1B to switch output 1A so that the output voltage of attenuator 46 is applied through resistor 56 to coil 12 via the junction 32. FIG. 3 shows the equivalent circuit for the detection coil 12 and resistance network 20 when the attenuator output voltage (assumed to be larger than bias voltage V2) is applied and the detection coil is not open. The total current $I_T$ flowing from the attenuator through switch 50 and resistor 56 divides at junction 32 with a first portion $I_1$ flowing through the detection coil 12, having a resistance $R_C$, and resistor $R_2$ to junction 30. The second part $I_2$ of the total current $I_T$ flows through resistor $R_1$ to junction 30.

The potential difference between the ends of coil 12, that is between junctions 32 and 34, is $$I_1 \left( \frac{R_C}{R_c + R_2} \right).$$

This potential difference is applied to the inputs of differential amplifier 22 hence the resistance of the detection coil determines the magnitude of output signal from the amplifier.

If coil 12 should be shorted out completely so that it has no resistance then in FIG. 3 $R_C$ will be zero and there will be no potential drop between junctions 32 and 34. Therefore, when the coil is shorted the differential amplifier will produce no output signal.

If coil 12 should be open then the current $I_1$ cannot flow. Junction 34 assumes the same potential as junction 30 hence the full potential difference between junctions 32 and 30 is applied across the inputs of amplifier 22 and it produces a maximum output signal.

The resistance of one of the detection coils 10, 12 is tested under control of a program routine executed by microcomputer 42. The routine may be part of a diagnostic routine called when power is turned on or when an operator initiates the routine by actuation of a control on a control panel (not shown)

The microcomputer 42 first loads into register 48 a code word designating the detection coil whose resistance is to be tested. This causes register 48 to produce the signal SW1 if the resistance of coil 12 is to be tested or the signal SW4 if the resistance of coil 10 is to be tested. This enables one switch 50 so that the output of attenuator 46 is connected to one of the coils 10, 12.

The microcomputer 42 stores a table of sine wave values in ROM memory and every 2.5 ms the microcomputer enables DAC 44 and transfers one of these values to a holding register in the DAC. The DAC converts the sine wave values to an output voltage which is applied through the attenuator 46 and switch 50 to the designated detection coil 10, 12. Assuming the output of the attenuator is applied to detection coil 12 channel 1 produces an output signal CH1 on lead 36 having a magnitude dependent on the resistance of coil 12.

The microcomputer 42 then turns ADC 40 on and every 2.5 ms transfers from the ADC to the microcomputer the digital signals produced by the ADC and representing the magnitude of the signal on lead 36.

A peak detector 66 and a comparator 68 are implemented by programming in the microcomputer 42. The peak detector detects the peak positive value of the values received from ADC 40. The ROM in the microcomputer holds first and second threshold or reference signal values representing a maximum magnitude and a minimum magnitude, respectively, that an output signal on lead 36 or 38 may have when the resistance of coil 10 or coil 12 is within an acceptable range.

The magnitude of the test signal injected into the detection circuits is known and from the design and configuration of the detection circuits and detection coils the magnitudes of the output signals from the detection circuits may be calculated. The reference signal values are offset above and below the calculated magnitude depending on how much variation in coil resistance may be tolerated.

The microcomputer 42 compares the positive peak value produced by the peak detector with each of the reference signal values. If the comparison indicates that the peak value derived from the ADC signals has a magnitude greater than the reference maximum magnitude or less (i.e. more negative) than the reference minimum magnitude then the resistance of the coil being tested is outside the acceptable range. In this case the microcomputer sends to a display 60, via the serial data link 43 and microcomputer 45, a code indicating that a coil is defective.

The resistance of coil 10 is tested in a similar manner except that register 48 is loaded with the code 0001 0000 and the microcomputer controls ADC 40 to sample the resulting detector output signal CH0 on lead 38.

Since successive sine wave values are transferred to DAC 44 during a test, the signal injected into the coil being tested is a sine wave. The frequency of this sine wave is quite low so that the signal produced at the output of the differential amplifier will pass through the low pass filter 24.

A specific preferred embodiment of the invention has been described in detail to illustrate the principles of the invention. It will be understood that various modifications and substitutions may be made in the described embodiment without departing from the spirit and scope of the invention as defined by the appended claims. For example, the test signal need not be a sine wave signal although a sine wave is preferred. Furthermore, the invention is not limited to use with the specific metal detector described herein but may be used with many types of metal detectors.

I claim:

1. A method of testing the resistance of a detection coil in a magnetic metal detector wherein the detection coil has first and second ends connected to first and second inputs of a detector circuit which produces an output signal having a magnitude proportional to a difference in potential at said first and second ends, said method comprising:

injecting a test signal of varying magnitude into one of said first and second ends of the detection coil to whereby the detector circuit output signal has a magnitude that varies as said test signal varies and is dependent on the resistance of the detection coil;

while said test signal is varying, determining the magnitude of the output signal produced by said detector circuit relative to first and second reference signal values representing a maximum and a minimum magnitude, respectively, that said output signal may have when the resistance of said detection coil is within a normal range; and producing an indication that the resistance is outside said normal range when the magnitude of said output signal is greater than said first reference signal value or less than said second reference signal value.

2. A method as claimed in claim 1 wherein said test signal of varying magnitude is a sine wave signal.

3. A method as claimed in claim 2 wherein the step of determining the magnitude of said output signal relative to said first and second reference values comprises:

converting said output signal to digital values representing magnitudes of said output signal as said sine wave signal varies; and, comparing said digital values with digital values representing said first and second reference signal values.

4. Apparatus for testing the resistance of a detection coil in a magnetic metal detector, the magnetic metal detector having a balanced resistor network including first and second resistors and a bias voltage source connected to a first end of the first and second resistors, and differential amplifier means for producing an output signal, a second end of said first resistor being coupled to a first end of said detection coil and a first input of said differential amplifier means and a second end of said second resistor being coupled to a second end of said detection coil and a second input of said differential amplifier means, said apparatus further comprising:

means for injecting a test signal of varying magnitude into said metal detector at a point between a second end of one of said first and second resistors and an end of said detection coil to thereby develop across said detection coil a potential difference having a magnitude related to the resistance of the detection coil whereby said differential amplifier means produces an output signal having a magnitude that varies as the magnitude of said test signal varies and is related to the resistance of said detection coil;

means, operative while said test signal is varying, for comparing the magnitude of the output signal from said differential amplifier means with first and second threshold magnitudes representing the maximum and minimum magnitudes, respectively, that said output signal should have when the resistance of said detection coil is within a normal range; and, means for producing an indication that said detection coil is defective when the magnitude of said output signal is greater than said first threshold magnitude or less than said second threshold magnitude at any time during injection of said test signal.

5. Apparatus for testing the resistance of a detection coil in a magnetic metal detector wherein the detection coil has first and second ends connected to first and second inputs of a detector circuit which produces an output signal having a magnitude dependent on a difference in potential at said first and second inputs, said apparatus comprising:

means for injecting a test signal of varying magnitude into the detection coil to produce across said detection coil and said first and second inputs a potential difference that is dependent on the resistance of the detection coil;

comparing means, operative while said test signal is varying in magnitude, for repetitively comparing the magnitude of the output signal produced by said detector circuit with first and second reference signal values representing a maximum and a minimum magnitude, respectively, that said output signal may have when the resistance of said detection coil is within a normal range; and means for producing an indication that the resistance is outside said normal range if the magnitude of said output signal becomes greater than said first reference signal value or less than said second reference signal value at any time while said test signal is being injected.

6. Apparatus as claimed in claim 5 wherein said means for injecting said test signal includes a microcomputer for supplying digital values to a digital to analog converter to generate said test signal and means connecting said digital to analog converter to said detection coil.

7. Apparatus as claimed in claim 5 and further including an analog to digital converter responsive to said output signal from said detection circuit for producing digital values representing the magnitude of said output signal, and a microcomputer, said microcomputer including said comparing means and memory means for storing said first and second reference signal values, said comparing means comprising means for comparing each of said digital values with both said first and second reference signal values.

8. Apparatus as claimed in claim 7 wherein said means for injecting said test signal includes a digital to analog converter having an output connected to said detection coil, means for storing a table of values representing a sine wave, and means for applying one value at a time from said table of values to said digital to analog converter whereby said test signal is a varying sine wave signal.

9. Apparatus as claimed in claim 7 wherein said means for comparing comprises a peak detector for detecting a peak value from among said digital values and a comparator for comparing said peak value with said first and second reference signal values.

10. Apparatus as claimed in claim 6 wherein the magnetic metal detector has a second detection coil having ends coupled to inputs of a second detection circuit which produces a second output signal, said apparatus further comprising:

switch means for selectively connecting said digital to analog converter to said second coil to inject said test signal into said second coil; and, means, operative while said test signal is being injected into said second coil, for determining if the magnitude of an output signal produced by said second detection circuit falls within a predetermined range of magnitudes.

11. Apparatus as claimed in claim 5 wherein said means for injecting a test signal comprises means for injecting the test signal into a detection coil located adjacent a crop feed path of a harvesting machine.

* * * * *